United States Patent [19]

Smith et al.

[11] Patent Number: 4,514,629
[45] Date of Patent: Apr. 30, 1985

[54] SCANNING TRANSMISSION ELECTRON MICROSCOPES

[75] Inventors: Kenneth C. A. Smith, Cambridge, England; Stephen J. Erasmus, Mountain View, Calif.

[73] Assignee: National Research Development Corporation, London, England

[21] Appl. No.: 509,054

[22] Filed: Jun. 29, 1983

[30] Foreign Application Priority Data

Jul. 7, 1982 [GB] United Kingdom ............... 8219647

[51] Int. Cl.³ ............................................. G01N 23/00
[52] U.S. Cl. ..................................... 250/311; 250/357
[58] Field of Search ................. 250/311, 397; 382/31, 382/32

[56] References Cited

U.S. PATENT DOCUMENTS 3,626,184 12/1971 Crewe .................................. 250/311
3,675,203 7/1972 Baumann .............................. 382/32
4,068,123 1/1978 Kokubo ............................... 250/311
4,160,162 7/1979 Müller et al. ....................... 250/311
4,399,360 8/1983 Fotino ................................. 250/397

Primary Examiner—Bruce C. Anderson
Attorney, Agent, or Firm—Cushman, Darby & Cushman

[57] ABSTRACT

In a scanning transmission electron microscope 1 the image of the diffraction pattern formed on a phosphor screen 6 as a result of electron beam impingement on a point on the specimen 4 is converted by a camera 7 into a video signal and digitized in an ADC convertor 9 and stored in a digital store 10. The stored signal is then modified by a weighting factor representing a notional pattern overlaying screen 6. The weighting factor may have one of two binary values, representing a notional opaque and transparent pattern, or may have a multiplicity of different values. The modified signals are then added together to provide a picture value for the point of impingement. By this means a complete picture is built up point-by-point.

To speed up the picture taking operation diffraction images from different points may be displayed on different parts of screen 6 so that several images can be scanned together by camera 7.

6 Claims, 8 Drawing Figures

SCANNING TRANSMISSION ELECTRON MICROSCOPES

This invention relates to scanning transmission electron microscopes.

In a scanning transmission electron microscope (STEM) an electron beam is focused onto a point on a specimen resulting in the transmission of electrons through the specimen. A phosphor screen is provided onto which diffracted electrons are projected to form an image. This image is detected by a detector comprising a pattern of light-sensitive elements. Various forms of pattern have been suggested for the detector. In one class of detector there are patterns of annular zones, semi-circles or quadrants. One of the drawbacks of these detectors is that their output for phase objects is linearly related to the phase shift produced by the specimen only for relatively small phase shifts and quantitative information can therefore be extracted from weak phase objects only.

An improved detector has been suggested which produces an output proportional to the phase gradient of the specimen even for strong phase objects. Such a detector requires detector elements of different sensitivities depending on their position and is extremely difficult to construct.

It is an object of the present invention to provide means for detecting the output of a transmission electron microscope which allows the simulation of a wide range of detector patterns including ones with varying sensitivity.

According to the invention a scanning transmission electron microscope includes means for deriving a video signal representing the image of a diffraction pattern derived from electron beam impingement on a point in a specimen, means for converting the video signal into digital form, a digital store for storing a plurality of digital values each representing a picture point in the said image modified by a factor representing a notional pattern overlaying the screen, and means for integrating all the modified values to provide a picture value for the point of impingement of the electron beam.

In carrying out the invention an electron beam is directed onto successive points in the specimen and at each point of impingement a diffraction image is obtained, digitised and then modified by a weighting factor representing a notional pattern and finally integrated to provide a point picture value. By this means a complete picture of the specimen is built up point-by-point.

Preferably the diffraction pattern in projected onto a phosphor screen and a scanning camera is provided to scan the screen and obtain the video signal.

The build up of a picture of a specimen from a sequence of diffraction images each representing a single picture point will inevitably be slow. To increase the speed of recording, the microscope may be adjusted so that the diffraction image derived from a point of impingement does not cover the entire phosphor screen but is limited to a part thereof. A plurality of images from successive points of impingement are then formed at different parts of the screen. To detect this multiple image the notional overlay pattern that is used to derive the modifying weighting factor is in the form of a plurality of individual patterns each related to a corresponding part of the screen.

The pattern being represented may comprise two different types of notional area and signals from one type of area are subtracted from signals from the other type. Alternatively one type of area may be treated as opaque and the other type as transparent. The digital values of the different areas may thus be "+1" and "−1" or "0" and "1". Alternatively, the pattern represented may comprise regions of progressively different degrees of digital weighting varying between "+1" and "−1".

In carrying out the invention it may be convenient to store a plurality of values each being a digital representation of a point in the image and then carry out an arithmetic operation by which each value in the digital store is modified by multiplying it by the appropriate value representing the overlay pattern at that point.

In order that the invention may be more fully understood, reference will now be made to the accompanying drawing in which.

Figure 1:
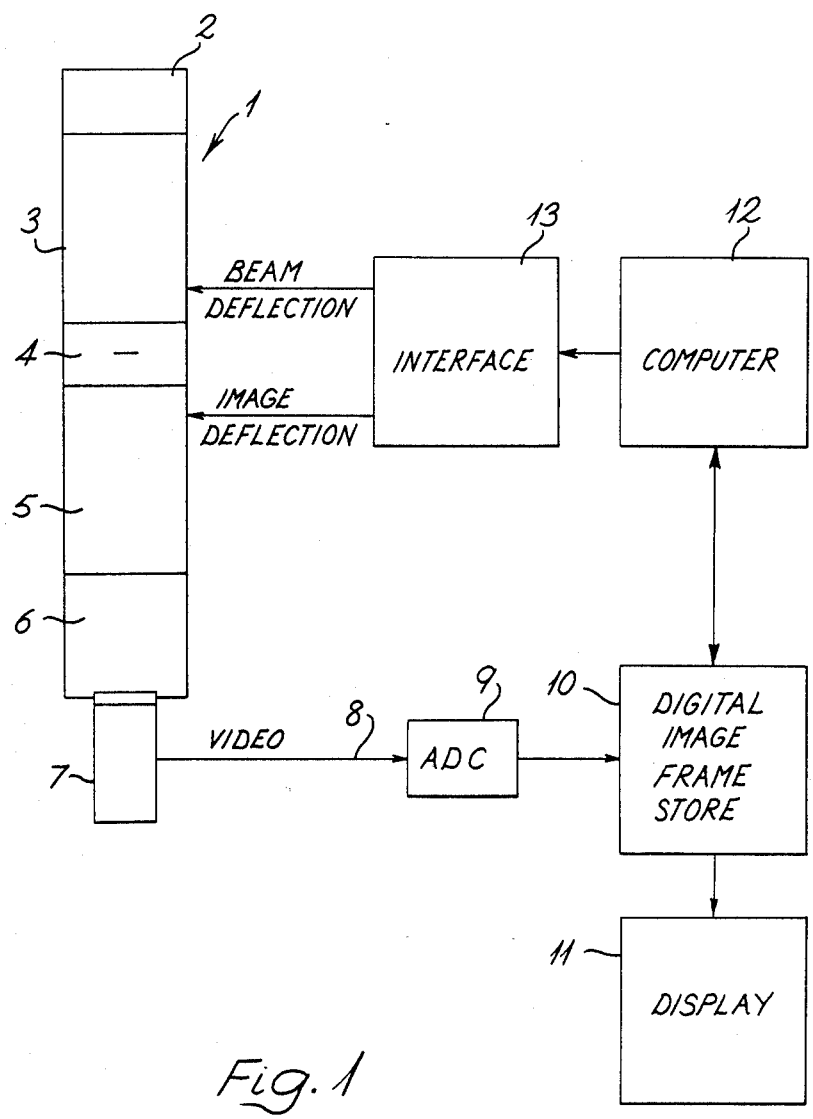
FIG. 1 shows an embodiment of the invention in diagrammatic form.

Referring now to FIG. 1 there is shown therein a transmission electron microscope 1 comprising an electron gun 2 the beam from which is focused by condenser lenses 3 onto a specimen 4. The point of impingement of the beam on the specimen causes diffraction of the electrons which are focused by projector lenses 5 onto a phosphor screen 6. A low light level television-type scanning camera 7 is positioned to record the image on phosphor screen 6. The output from camera 7 is in the form of a video signal which is passed along a line 8 to an analogue-to-digital converter 9 and thence to a digital image frame store 10. The information in store 10 may be monitored on a display 11.

Digital frame store 10 comprises a plurality of locations arranged in rows and columns and at each location a digital value is stored corresponding to the magnitude of the detector signal at the corresponding location in the image on screen 6 scanned by camera 7. An arithmetic operation is carried out on the digital values stored in frame store 10 by multiplying the stored contents by modifying factors. The modifying factors represent a notional pattern, examples of which are shown in FIG. 2.

Figure 2A:
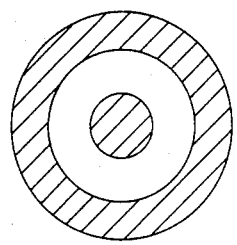
FIGS. 2(a–d) show examples of notional overlay patterns.
Figure 2B:
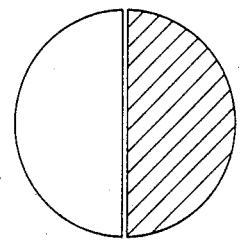

The patterns may comprise the concentric circles of FIG. 2a or the semi-circles of FIG. 2b.

Figure 2C:
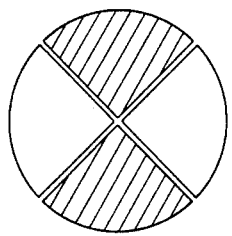
Figure 2D:
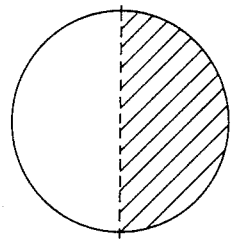

The shaded areas of FIG. 2a and FIG. 2b are given in values "+1" and the unshaded areas are given the value "−1". Alternatively, as shown in FIG. 2c, the overlay pattern may comprise notional opaque and transparent areas which are given values "0" and "1" respectively. A more sophisticated arrangement is shown in FIG. 2d where there is a continuous variation across the patterned area and each point on the pattern is given an appropriate digital value between −1 and +1. One or other of the patterns shown in FIG. 2 or any other suitable pattern is chosen and the values stored in frame store 10 modified so that the resulting digital values that are stored correspond to what would have been stored had the image been viewed through the selected notional pattern.

The system described with reference to FIG. 1 operates as follows. Computer 12, operating through interface 13, first sets the condenser scan coils of the condenser lenses 3 to position a well focused beam onto the specimen 4. The projector lenses 5 are then adjusted to project the diffraction pattern onto the phosphor screen 6, producing an image which is scanned by the TV camera 7 and converted to digital form in ADC 9 and then stored in frame store 10. The digitised image is multiplied by a weighting function to correct for camera shading and to simulate the notional overlay pattern of the required detector, and the product is integrated over the detector area to produce a single point of the final image. The beam is then moved to the next point on specimen 4 and the procedure repeated until a complete image has been built up.

Store 10 includes a multiplier which carries out the multiplication of an image by the weighting function and the integration is performed by an accumulator. The area of integration is marked out using an overlay plane.

The advantage of this system is its flexibility since it can be configured as any of the detectors described with reference to FIG. 2 and its characteristics can be altered rapidly allowing the same area of a specimen to be examined with different detectors. It also allows one to optimise the ring diameters of the detector of FIG. 2a, the performance of which depends on matching the defocus of the microscope to the ring diameters. In addition, this system can test detectors which cannot be realised practically.

The disadvantage of this system is that it is slow since, for each frame taken by the TV camera, only one point is found in the final image. At a frame rate of 25 Hz, a typical 128 point square image would take nearly 11 minutes to produce. By collecting a point during every field of the interlaced TV signal (1 frame=2 fields) the time can be reduced to 5.5 minutes which is, however, still too slow. The speed can be increased further only by taking in several points in every TV field. This may be accomplished by adjusting the microscope to produce a small diffraction pattern filling only a small part of the TV camera's field of view. Several diffraction patterns obtained sequentially from different points on the specimen can be positioned by the shift coils in the projector system to fill the field of view. The target of the camera will store the diffraction patterns until they are read by the reading beam in the camera, allowing several points to be collected in each field.

Figure 3A:
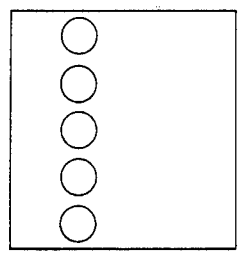
FIGS. 3(a–c) show overlay patterns for the detection of multiple images.
Figure 3B:
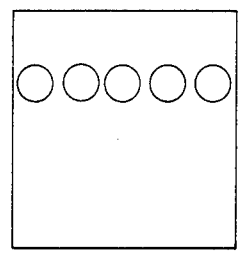

The time taken to produce an image using this method depends on the number of integrators and the manner in which the diffraction patterns are shifted. If the diffraction patterns are placed in a vertical column on the camera target as shown in FIG. 3a, then each line of the TV signal contains information from only one pattern and a single integrator can be used operating on each pattern in turn. If, however, the patterns are in a horizontal row as shown in FIG. 3b an integrator is required for each pattern and similarly, if the patterns are in a regular array, see FIG. 3c, an integrator is needed for each column.

Figure 3C:
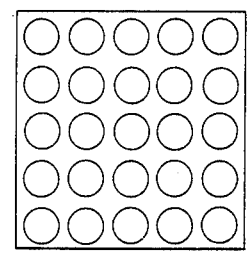

If patterns fill the field of view as in FIG. 3c, the time taken to collect an N×N image, where each pattern is M×M is $$T = (N^2 M^2 / 256^2) \times 20 \text{ ms}$$

and

No. of integrators $= 256/M$

This is shown in Table 1, which gives scan time in seconds using the full detector area

TABLE 1

| | | Points in Detector | | | |
|---|---|---|---|---|---|
| | | $8^2$ | $16^2$ | $32^2$ | $64^2$ |
| Point in Image | $16^2$ | 0.005 | 0.02 | 0.08 | 0.32 |
| | $32^2$ | 0.02 | 0.08 | 0.32 | 1.28 |
| | $64^2$ | 0.08 | 0.32 | 1.28 | 5.12 |
| | $128^2$ | 0.32 | 1.28 | 5.12 | 20.5 |
| | $256^2$ | 1.28 | 5.12 | 20.5 | 81.9 |
| | $512^2$ | 5.12 | 20.5 | 81.9 | 328.0 |
| | | 32 | 16 | 8 | 4 |
| | | No. of integrators | | | |

If only a single column of patterns of FIG. 3a is used requiring only one integrator, the time taken is $$T = (N^2 M / 256^2) \times 20 \text{ ms}$$

and is shown in Table 2 which also gives scan time in seconds using one counter only.

TABLE 2

| | | Points in Detector | | | |
|---|---|---|---|---|---|
| | | $8^2$ | $16^2$ | $32^2$ | $64^2$ |
| Point in Image | $16^2$ | 0.16 | 0.32 | 0.64 | 1.28 |
| | $32^2$ | 0.64 | 1.28 | 2.56 | 5.12 |
| | $64^2$ | 2.56 | 5.12 | 10.2 | 20.5 |
| | $128^2$ | 10.2 | 20.5 | 41.0 | 81.9 |
| | $256^2$ | 41.0 | 81.9 | 164.0 | 328.0 |
| | $512^2$ | 164.0 | 328.0 | 655.0 | 1310.0 |
| | | 1 | 1 | 1 | 1 |
| | | No. of integrators | | | |

A typical diffraction pattern covering an area of 32×32 points can be analysed using 8 integrators to produce a 128×128 image in 5 seconds and a 32×32 image (for focusing) in 0.3 seconds. The experimental system has only a single integrator and takes 8 times longer, but should be sufficiently fast to illustrate the principle.

The deflection of the diffraction pattern must be synchronised with the scanning of the TV camera, and must be arranged so that patterns are being exposed onto the camera target a little way in front of the reading beam. This function can be performed by the computer. It is not necessary to blank the beam of the microscope while shifting the pattern provided that the time spent in shifting is much less than that spent stationary.

In a TV camera, the electron beam which reads the image from the target also erases the target. Incomplete erasure, known as camera lag, is likely to be objectionable because information from one point of the specimen could remain on the camera target and affect the next point using the same target area. Lag can be reduced by adjusting the camera correctly, but if it is still troublesome, there is an easy solution if the patterns are in a single column as in FIG. 3a. The column should be shifted to different horizontal positions in successive fields so that each area of the target is used once in several fields.

We claim:

1. A scanning transmission electron microscope including means for obtaining a video signal representing the image of a diffraction pattern derived from electron beam impingement on a point in a specimen, means for converting the video signal into digital form, a digital store for storing a plurality of digital values each representing a picture point in the said image modified by a weighting factor representing a notional pattern overlaying the screen, and means for integrating all the modified values to provide a picture value for the point of impingement of the electron beam.

2. A microscope as claimed in claim 1 and including means for causing the electron beam to scan successive points in the specimen to enable a complete picture of a specimen to be built up point-by-point.

3. A microscope as claimed in claim 1 in which the diffraction pattern in projected onto a phosphor screen and a scanning camera is provided to scan the screen for the purpose of obtaining the video signal.

4. A microscope as claimed in claim 3 in which the diffraction pattern from a point of impingement is projected to part only of the phosphor screen and patterns from different points of the specimen and formed on different parts of the screen.

5. A microscope as claimed in claim 1 in which the weighting factor has a plurality of different values.

6. A microscope as claimed in claim 5 in which the weighting factor has two possible values.

* * * * *